(12) United States Patent
Mains et al.

(10) Patent No.: US 10,486,264 B2
(45) Date of Patent: Nov. 26, 2019

(54) WAFER ALIGNMENT METHOD AND SYSTEM

(71) Applicant: Illumina, Inc., San Diego, CA (US)

(72) Inventors: Peter Mains, San Diego, CA (US); Anmiv S. Prabhu, San Diego, CA (US); Richard Capella, San Diego, CA (US); Kevan Samiee, San Diego, CA (US)

(73) Assignee: ILLUMINA, INC., San Diego, CA (US)

( * ) Notice: Subject to any disclaimer, the term of this patent is extended or adjusted under 35 U.S.C. 154(b) by 0 days.

(21) Appl. No.: 16/383,266

(22) Filed: Apr. 12, 2019

(65) Prior Publication Data

US 2019/0232421 A1 Aug. 1, 2019

Related U.S. Application Data

(62) Division of application No. 15/848,127, filed on Dec. 20, 2017, now Pat. No. 10,300,554.

(Continued)

(51) Int. Cl.
*B23K 26/00* (2014.01)
*B29C 65/00* (2006.01)
(Continued)

(52) U.S. Cl.
CPC ............ *B23K 26/02* (2013.01); *B23K 26/032* (2013.01); *B23K 26/0853* (2013.01);
(Continued)

(58) Field of Classification Search
CPC ........ B23K 26/00; B23K 26/02; B23K 26/20; B23K 26/21; B23K 26/03; B23K 26/032;
(Continued)

(56) References Cited

U.S. PATENT DOCUMENTS 5,060,043 A  10/1991 Yasue
5,205,028 A   4/1993 Leonard
(Continued)

FOREIGN PATENT DOCUMENTS

JP   2004/296907   10/2004
JP   2011/216832   10/2011

OTHER PUBLICATIONS

PCT/US2017/067496, International Search Report and Written Opinion dated Apr. 16, 2018, 8 Pages.

*Primary Examiner* — Jacob T Minskey
*Assistant Examiner* — Matthew Hoover
(74) *Attorney, Agent, or Firm* — Illumina, Inc.

(57) ABSTRACT

Wafers are aligned with one another by reference to features formed on or in each wafer. A method includes forming a first pivot-notch, a first stop-notch, and a first bias-notch in a first wafer by reference to first features formed on or in the first wafer. Also formed is a second pivot-notch, a second stop-notch, and a second bias-notch in a second wafer by reference to second features formed on or in the second wafer. A first wafer is mounted in an aligning device, wherein a two-contact element enters into the first pivot-notch, and a single-contact element enters the first stop-notch. The second wafer is mounted in the aligning device, wherein the two-contact element enters into the second pivot-notch, and the single-contact element enters the second stop-notch. A biasing force is exerted onto surfaces of the first and second bias-notches to align the first features with the second features.

9 Claims, 6 Drawing Sheets

Related U.S. Application Data

(60) Provisional application No. 62/452,602, filed on Jan. 31, 2017.

(51) Int. Cl.

| | | |
|---|---|---|
| *B23K 26/02* | (2014.01) | |
| *B23K 26/21* | (2014.01) | |
| *B29C 65/78* | (2006.01) | |
| *B23K 26/402* | (2014.01) | |
| *B23K 26/03* | (2006.01) | |
| *B23K 26/38* | (2014.01) | |
| *B23K 26/324* | (2014.01) | |
| *B23K 26/08* | (2014.01) | |
| *B23K 101/40* | (2006.01) | |
| *B23K 103/00* | (2006.01) | |

(52) U.S. Cl.
CPC ............ *B23K 26/21* (2015.10); *B23K 26/324* (2013.01); *B23K 26/38* (2013.01); *B23K 26/402* (2013.01); *B29C 65/7814* (2013.01); *B23K 2101/40* (2018.08); *B23K 2103/54* (2018.08)

(58) Field of Classification Search
CPC .. B23K 26/08; B23K 26/085; B23K 26/0853; B23K 26/30; B23K 26/32; B23K 26/324; B23K 26/38; B23K 26/40; B23K 26/40; B23K 26/402; B29C 65/00; B29C 65/70; B29C 65/78; B29C 65/781; B29C 65/7814
See application file for complete search history.

(56) References Cited

U.S. PATENT DOCUMENTS

| | | | |
|---|---|---|---|
| 5,808,721 A * | 9/1998 | Wood | B29D 11/0073 351/159.01 |
| 6,275,742 B1 | 8/2001 | Sagues | |
| 6,554,560 B2 | 4/2003 | Sinha | |
| 7,022,211 B2 | 4/2006 | Yoshioka | |
| 7,453,160 B2 | 11/2008 | Ray | |
| 8,286,929 B2 | 10/2012 | Law et al. | |
| 2004/0246795 A1* | 12/2004 | Tomita | H01L 21/76251 365/200 |
| 2009/0116949 A1* | 5/2009 | Han | H01L 21/68 414/757 |

* cited by examiner

WAFER ALIGNMENT METHOD AND SYSTEM

CROSS-REFERENCE TO RELATED APPLICATIONS

This application is a divisional of U.S. application Ser. No. 15/848,127, filed on Dec. 20, 2017, which claims the benefit of U.S. Provisional Application Ser. No. 62/452,602, filed Jan. 31, 2017; each of the aforementioned disclosures is incorporated herein by reference in its entirety.

BACKGROUND

A number of applications exist for supports or structures in the form of wafers that have features formed in, or on them. In many cases the features will become part of a final product once wafers are assembled and joined to one another. Where the features of more than one wafer are to be aligned with one another, alignment may be performed at a wafer level, or following cutting of the wafers into parts. Where it is desired to perform the alignment and assembly of the wafers prior to separation of the features from one another, that is, at the wafer level, challenges may arise. For example, challenges may occur in properly placing and adjusting positions of one or more of the wafers so that they are properly aligned with one another, or so that the features of each wafer are aligned with one another to a degree desired in the final product.

Addressing these challenges can be demanding in terms of the wafer processing, feature forming and detection, as well as the fixturing and processing components used during the alignment and assembly operations. As feature sizes become smaller, the challenges involved in alignment, processing, and assembly (e.g., bonding) can become increasingly difficult.

INTRODUCTION

In accordance with a first aspect of the disclosure, a method comprises forming a first pivot-notch, a first stop-notch, and a first bias-notch in a first wafer by reference to first features formed on or in the first wafer, and forming a second pivot-notch, a second stop-notch, and a second bias-notch in a second wafer by reference to second features formed on or in the second wafer. The first wafer is mounted in an aligning device, wherein a two-contact element enters into the first pivot-notch, and a single-contact element enters the first stop-notch. The second wafer is also mounted in the aligning device, wherein the two-contact element enters into the second pivot-notch, and the single-contact element enters the second stop-notch. A biasing force is exerted onto surfaces of the first and second bias-notches to align the first features with the second features.

An example of the method further comprises bonding the first wafer to the second wafer after the first and second features are aligned. This example of the method may further comprise securing a spacing element to the first wafer prior to alignment, wherein the second wafer is bonded to the spacing element.

An example of the method further comprises forming, using at least laser cutting, the first and second pivot-notches, the first and second stop-notches and the first and second bias-notches. In this example, the first and second features comprise patterned arrays or fiducials disposed in or adjacent to the patterned arrays.

In an example of the method, the biasing force is exerted by a spring-loaded pusher that contacts the surfaces of the first and second bias-notches.

In an example of the method, upon exertion of the biasing force, the first and second wafers pivot about a pivotal center defined by the two-contact element and the first and second pivot-notches until the single-contact element rests against a stop surface of each of the first and second stop-notches.

In an example of the method, aligned positions of the first and second wafers are defined by two-point contact of the pivot-notches with the two-contact element, and single-point contact of the stop-notches with the single-contact element. In this example, the first and second bias-notches are formed at different distances from the first and second features, respectively.

It is to be understood that any features of the method may be combined together in any desirable manner and/or configuration.

In accordance with another aspect of the disclosure, a system comprises a wafer notched for alignment with a second wafer, the wafer comprising a pivot-notch formed by reference to a feature formed on, or in the wafer; a stop-notch approximately across from the pivot-notch and formed by reference to the feature formed on or in the wafer, and a bias-notch on a side of the wafer between the pivot-notch and the stop-notch and at a location where a biasing force exerted on the bias-notch will urge the pivot-notch into two-point contact with a two-contact alignment element of a fixture and also urge the stop-notch into single-point contact with a single-contact alignment element.

In an example of the system, the pivot-notch has an included angle of between about 50 degrees and about 70 degrees.

In an example of the system, the stop-notch has a stop surface that is oriented transverse to an outer perimeter of the wafer.

In an example of the system, the wafer is circular, and the bias-notch is located at a location of between about 30 and about 40 degrees from a stop surface of the stop-notch.

In an example of the system, the wafer comprises glass, and wherein the feature comprises at least two fiducial marks that can be imaged during forming of the notches.

It is to be understood that any features of the system may be combined together in any desirable manner. Moreover, it is to be understood that any combination of features of the system and/or of the method may be used together, and/or that any features from either or both of these aspects may be combined with any of the examples disclosed herein.

In accordance with another aspect of the disclosure, a system comprises a notching station to form notches in first and second wafers, the notches in each wafer comprising a pivot-notch formed by reference to a feature formed on or in the respective wafer; a stop-notch across from the pivot-notch and formed by reference to the feature formed on or in the respective wafer, and a bias-notch on a side of the respective wafer between the pivot-notch and the stop-notch and at a location where a biasing force exerted on the bias-notch will urge the pivot-notch of the respective wafer into two-point contact with a two-contact alignment element of a fixture and also urge the stop-notch of the respective wafer into single-point contact with a single-point alignment element of the fixture. The fixture is provided to align the features of the first and second wafers with one another, the fixture comprising the two-contact alignment element that contacts the pivot-notches of the wafers, the single-contact alignment element that contacts the stop-notches, and a biasing element that urges the pivot-notches into contact with the two-contact alignment element and the stop-notches into contact with the single-contact element. A bonding station is provided to bond the first wafer with respect to the second wafer after alignment.

In an example of this system, the notching station comprises a detection system to detect and locate the features of the first and second wafers for forming the notches. In an example, the detection system comprises a camera and the features comprise fiducial features formed on or in the wafers and detectable by the camera.

In an example of this system, the bonding station comprises a laser to weld the second wafer in an aligned position with respect to the first wafer. In an example, a spacer is bonded to the first wafer after forming of the notches in the first wafer, and wherein the second wafer is bonded to the spacer after alignment.

In an example of this system, the fixture is configured to be placed, with the wafers aligned, into the bonding station.

It is to be understood that any features of this example system may be combined together in any desirable manner. Moreover, it is to be understood that any combination of features of this example system and/or of the other example system and/or of the method may be used together, and/or that any features from either or any of these aspects may be combined with any of the examples disclosed herein.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1:
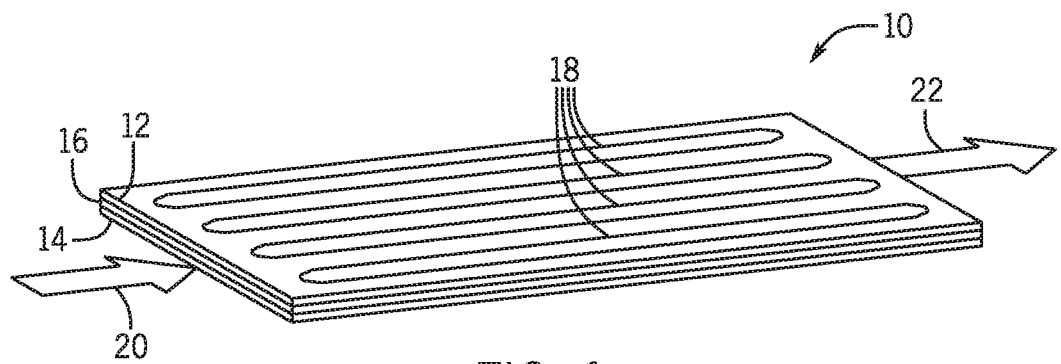
FIG. 1 is a perspective view of an example product made of two wafers aligned in accordance with the techniques disclosed.

A number of applications exist for aligned wafers, such as flow cells used for detection, imaging, or analysis of various analytes. In some applications, features on the wafers may be usefully aligned with one another during processing, and the aligned wafers may be secured, such as by bonding, with respect to one another to preserve the alignment. FIG. 1 illustrates an example flow cell 10 comprising an upper plate 12 and a lower plate 14. The plates 12, 14 are separated by an intermediate layer 16, sometimes referred to as an interposer. The interposer creates a space between the upper and lower plates 12, 14 into which an analyte of interest may be introduced. In the illustrated embodiment, the space comprises four flow channels 18, although many different configurations may be used. Moreover, in one example application, the flow cell 10 may encase or comprise features that support the analyte, and that are aligned with one another. In the illustrated example, the flow cell 10 includes at least one opening (not separately shown) for receiving a fluid, as indicated by arrow 20, and at least one additional opening (not separately shown) for permitting the fluid to exit the flow cell 10, as indicated by arrow 22.

In an example application, the flow cell 10 may receive molecular samples that are attached to sites formed as features on both the upper and lower plates 12, 14. The sites allow for attachment of the molecules, which may then be further processed, such as by hybridization, and for reactions with reagents introduced into the flow cell 10 during processing. In such applications, imaging may be performed on the analytes by directing radiation (i.e., light) at the molecules through the upper plate 12, the lower plate 14, or both. Other detection technologies could also be used. In the optical detection applications, one of the plates 12 or 14, or both may be made of a material that is transparent at the wavelengths of light used, such as glass. Moreover, such applications may include sequencing of molecules such as deoxyribonucleic acids (DNA) or ribonucleic acids (RNA), although the techniques described here are not limited to any particular application or analyte, or to flow cells 10 themselves.

Figure 2:
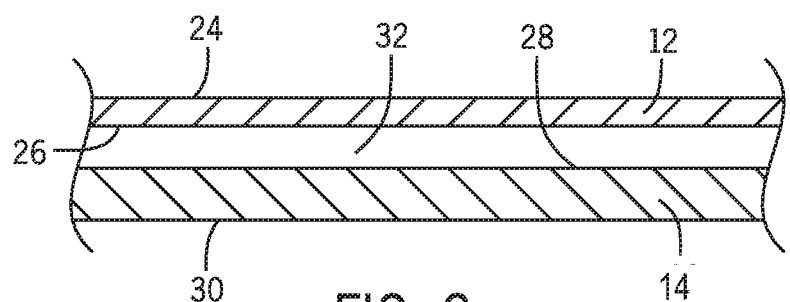
FIG. 2 is a cross-sectional, cut-away view through the example product of FIG. 1 illustrating the two wafer portions that are aligned and assembled in accordance with the techniques disclosed.

FIG. 2 is a partial sectional view of the flow cell 10 of FIG. 1. As noted, the flow cell comprises an upper plate 12 separated from a lower plate 14 by an interposer 16 that forms a space 32 between the plates. The upper plate 12 has an upper surface 24 and a lower surface 26. The lower plate 14 similarly has an upper surface 28 and a lower surface 30. The internal volume or space 32 between the lower surface 26 of the upper plate 12 and the upper surface 28 of the lower plate 14 receives the analyte, in this example. The features that are aligned, in this example, are formed on the lower surface 26 of the upper plate 12, and on the upper surface 28 of the lower plate 14. The alignment may facilitate recognition of analyte locations, such as through successive cycles of processing, reactions, imaging, and so forth. It should be noted, however, that in other applications features may be present on the upper surface 24 of the upper plate 12, and/or on the lower surface 30 of the lower plate 14, and these features may form the basis for the alignment disclosed.

Figure 3:
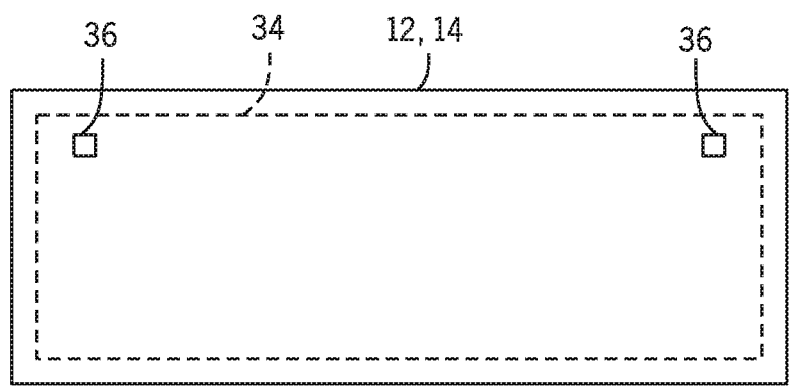
FIG. 3 is a plan view of one of the wafers used for the example product of FIG. 1.

FIG. 3 illustrates an example of feature placement on the upper and lower plates 12 and 14. In this example, the features 34 may comprise an area or region of the featured surface. The region itself may be broken into separate lanes, swaths, sub-regions, or sub-areas, which themselves may comprise individual sites or locations which are to be aligned. To facilitate the alignment techniques disclosed, the features 34 may include fiducial markers 36 which may be formed on or in the plates 12, 14. These fiducial markers 36 may be detectable during the alignment process disclosed herein and may be used as references for the alignment.

By way of example only, features 34 on or in the plates 12, 14 may comprise a patterned array, such as a microarray, a nanoarray, and so forth. In practice, the locations or sites of the features 34 may be disposed in a regular, repeating pattern, a complex non-repeating pattern, or in a random arrangement on one or more surfaces of the plates. The size of individual features 34 of such an array can be selected to suit a desired application. For example, in some embodiments the features 34 of an array can have a size that accommodates a single nucleic acid molecule alone. A surface having a plurality of features 34 in this size range is useful for constructing an array of molecules for detection at single molecule resolution. Features 34 in this size range are also useful in arrays having features 34 that each contain a colony of molecules. Thus, the features 34 of an array can each have an area that is no larger than about 1 mm$^2$, no larger than about 500 µm$^2$, no larger than about 100 µm$^2$, no larger than about 10 µm$^2$, no larger than about 1 µm$^2$, no larger than about 500 nm$^2$, or no larger than about 100 nm$^2$, no larger than about 10 nm$^2$, no larger than about 5 nm$^2$, or no larger than about 1 nm$^2$. Alternatively or additionally, the features 34 of an array may be no smaller than about 1 mm$^2$, no smaller than about 500 µm$^2$, no smaller than about 100 µm$^2$, no smaller than about 10 µm$^2$, no smaller than about 1 µm$^2$, no smaller than about 500 nm$^2$, no smaller than about 100 nm$^2$, no smaller than about 10 nm$^2$, no smaller than about 5 nm$^2$, or no smaller than about 1 nm$^2$. Indeed, a feature 34 can have a size that is in a range between an upper and lower limit selected from those exemplified above.

For examples that include having a plurality of features 34 or sites, the features 34 can be discrete from one another, i.e., the features 34 are separated with spaces between each other. An array may, for example, have features 34 that are separated by edge to edge distance of at most about 100 µm, about 50 µm, about 10 µm, about 5 µm, about 1 µm, about 0.5 µm, or less. Alternatively or additionally, an array can have features 34 that are separated by an edge to edge distance of at least about 0.5 µm, about 1 µm, about 5 µm, about 10 µm, about 50 µm, about 100 µm, or more. These ranges can apply to the average edge to edge spacing for features 34, as well as to the minimum or maximum edge to edge spacing.

In some examples, the features 34 may not be discrete, and instead, neighboring features 34 can abut each other. Whether or not the features 34 are discrete, the size of the features 34 and/or the pitch of the features 34 can vary such that arrays can have a desired density. For example, the average feature pitch in a regular pattern can be at most about 100 µm, about 50 µm, about 10 µm, about 5 µm, about 1 µm, about 0.5 µm, or less. Alternatively or additionally, the average feature pitch in a regular pattern can be at least about 0.5 µm, about 1 µm, about 5 µm, about 10 µm, about 50 µm, about 100 µm, or more. These ranges can apply to the maximum or minimum pitch for a regular pattern as well. For example, the maximum feature pitch for a regular pattern can be at most about 100 µm, about 50 µm, about 10 µm, about 5 µm, about 1 µm, about 0.5 µm, or less; and/or the minimum feature pitch in a regular pattern can be at least about 0.5 µm, about 1 µm, about 5 µm, about 10 µm, about 50 µm, about 100 µm, or more.

The density of features 34 can also be understood in terms of the number of features 34 present per unit area. For example, the average density of features 34 for an array can be at least about $1\times10^3$ features/mm$^2$, about $1\times10^4$ features/mm$^2$, about $1\times10^5$ features/mm$^2$, about $1\times10^6$ features/mm$^2$, about $1\times10^7$ features/mm$^2$, about $1\times10^8$ features/mm$^2$, or about $1\times10^9$ features/mm$^2$, or higher. Alternatively or additionally, the average density of features 34 for an array can be at most about $1\times10^9$ features/mm$^2$, about $1\times10^8$ features/mm$^2$, about $1\times10^7$ features/mm$^2$, about $1\times10^6$ features/mm$^2$, about $1\times10^5$ features/mm$^2$, about $1\times10^4$ features/mm$^2$, or about $1\times10^3$ features/mm$^2$, or less.

The features 34 in a patterned example can have any of a variety of pattern shapes and layouts. For example, when observed in a two dimensional plane, such as on the surface of one or both plates 12, 14, the features 34 can appear rounded, circular, oval, rectangular, square, symmetric, asymmetric, triangular, polygonal, or the like. The features 34 can be arranged in a regular repeating pattern including, for example, a hexagonal or rectilinear pattern. A pattern can be selected to achieve a desired level of packing. For example, round features 34 may be packed in a hexagonal arrangement. Of course, other packing arrangements can also be used for round features.

In general, a pattern might be characterized in terms of the number of features 34 that are present in a subset that forms the smallest geometric unit of the pattern. The subset can include, for example, at least 2, 3, 4, 5, 6, 10, or more features 34. Depending upon the size and density of the features 34, the geometric unit can occupy an area of less than about 1 mm$^2$, about 500 µm$^2$, about 100 µm$^2$, about 50 µm$^2$, about 10 µm$^2$, about 1 µm$^2$, about 500 nm$^2$, about 100 nm$^2$, about 50 nm$^2$, about 10 nm$^2$, or less. Alternatively or additionally, the geometric unit can occupy an area of greater than about 10 nm$^2$, about 50 nm$^2$, about 100 nm$^2$, about 500 nm$^2$, about 1 µm$^2$, about 10 µm$^2$, about 50 µm$^2$, about 100 µm$^2$, about 500 µm$^2$, about 1 mm$^2$, or more. Characteristics of the features 34 in a geometric unit, such as shape, size, pitch and the like, can be selected from those set forth herein more generally with regard to features 34 in an array or pattern.

Figure 4:
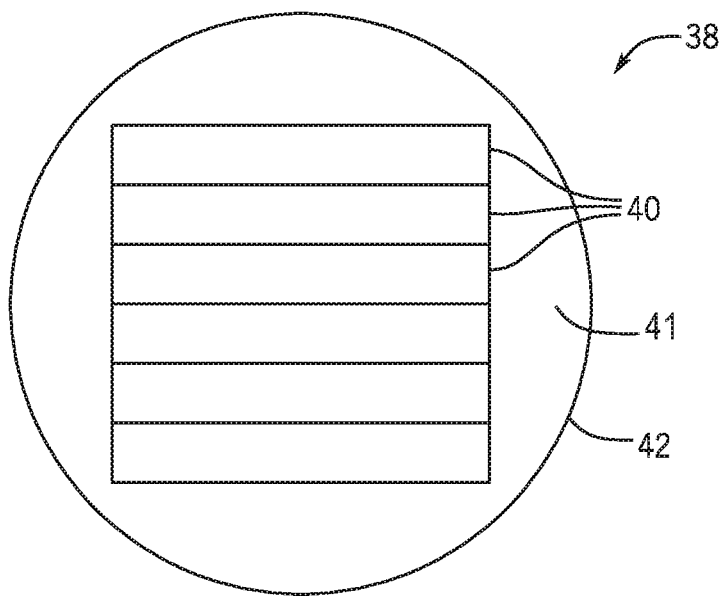
FIG. 4 is a plan view of an example wafer with features formed on, or in a surface of the wafer that are to be aligned with another wafer by reference to the features.

FIG. 4 illustrates an example wafer 38 that may be aligned with another wafer as disclosed herein. In this example, the wafer 38 comprises a glass sheet. Any suitable thickness of wafer 38 may be utilized, and the thickness may be selected based on the application. For example, in a contemplated example of a flow cell 10, a wafer 38 that will form an upper plate 12 may have a nominal thickness of about 0.3 mm, while a wafer 38 that will form a lower plate 14 may have a nominal thickness of about 1.0 mm. For another example, in a contemplated example of a flow cell 10, a wafer 38 that will form an upper plate 12 may have a nominal thickness of about 0.7 mm, and a wafer 38 that will form a lower plate 14 may have a nominal thickness of about 0.7 mm. The thickness of the respective plates 12, 14 may be any thickness, as long as the plates 12, 14 can be cut accurately to form the notches, etc. disclosed herein. In an example, the thickness of the lower plate 14 may range from about 0.7 mm to about 1.1 mm, and the thickness of the upper plate 12 may range from about 0.3 mm to about 0.7 mm. In the illustrated example, the wafer 38 has an initial circular shape, although other shapes may also be used.

Also illustrated in FIG. 4 are plate regions 40 that will form the plates 12 or 14 of the flow cell 10 discussed above. Here again, each of these plate regions 40 can comprise features 34 that are to be aligned with other features 34 on a second wafer during processing. In this example, the regions 40 are surrounded by a periphery 41 that is not utilized in the final products. It should be noted, however, that any desired layout of useful regions 40, patterns, objects, shapes, and so forth may be formed on or in the wafers 38 for alignment.

Figure 5:
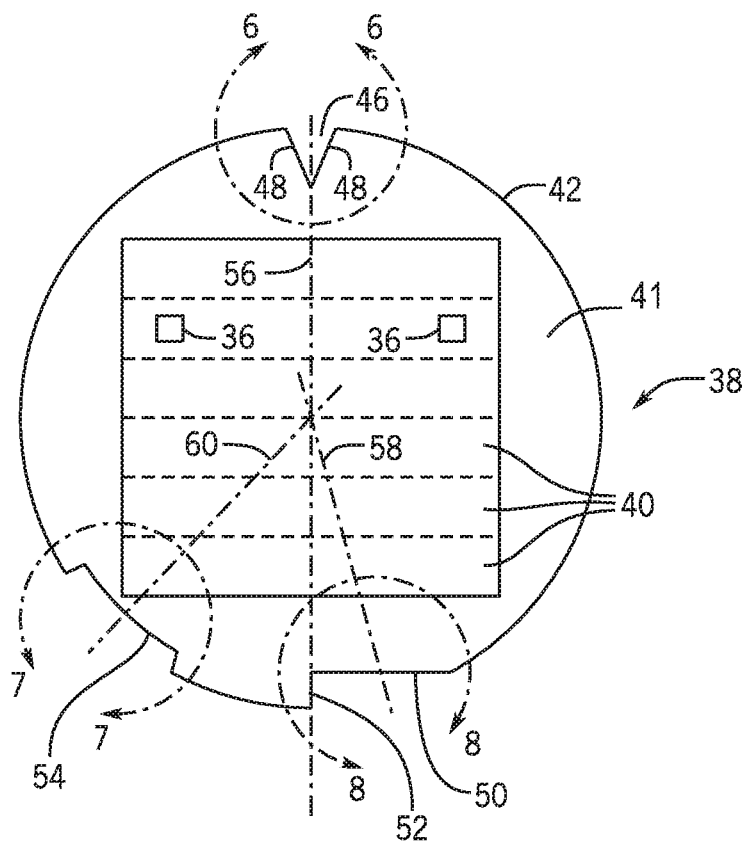
FIG. 5 is a plan view of the example wafer of FIG. 4 illustrating example notching of the wafer for alignment with another wafer.

In the illustrated example, the wafer 38 has a perimeter 42 that is not utilized as a reference for alignment. Rather, notches are formed in the wafer 38 by reference to the features 34 formed in or on one or more of its surfaces, as illustrated in FIG. 5. In the illustrated example, a pivot-notch 46 is formed in the perimeter 42. In this example, the pivot-notch 46 has a V-shape, although any suitable shape or form may be used. The pivot-notch 46 has edges 48 that facilitate alignment as discussed below. A stop-notch 50 is also formed in the perimeter 42 and comprises a stop or reference surface 52. Further, a bias-notch 54 is formed in the perimeter 42 to permit alignment by contact in the pivot-notch 46 and the stop-notch 50. While the notches 46, 50, 54 may be formed in various desired locations, in the illustrated example, the pivot-notch 46 may be considered a reference along an orientation line 56, while the stop-notch 50 may be located with respect to a second orientation line 58. One or more of lines 56 and 58 may serve to accurately locate the V-shaped edges 48 of the pivot-notch 46 and the reference surface 52 of the stop-notch 50 with respect to one another. The bias-notch 54 may be formed at an angle with respect to both the pivot-notch 46 and the stop-notch 50, as illustrated by orientation line 60. At least the edges 48 of the pivot-notch 46 and the reference surface 52 of the stop-notch 50 are located and formed by reference to the features 34 of the regions 40, and may be located and formed by reference to fiducials 36 of one or more of the regions 40.

In a presently contemplated example, the pivot-notch 46 has an included angle of about 60 degrees. The stop-notch 50 has a stop/reference surface 52 that is oriented generally transverse to an outer perimeter 42 of the wafer 38. Also, for a wafer 38 that is circular, the bias-notch 54 is located at a location of about 35 degrees from the stop/reference surface 52 of the stop-notch 50. It is contemplated that actual angles may deviate from these, such as including or between about 50 degrees and 70 degrees for the pivot-notch 46, and including or between about 30 degrees and 40 degrees for the displacement of the bias-notch 56 from the stop/reference surface 52.

Figure 6:
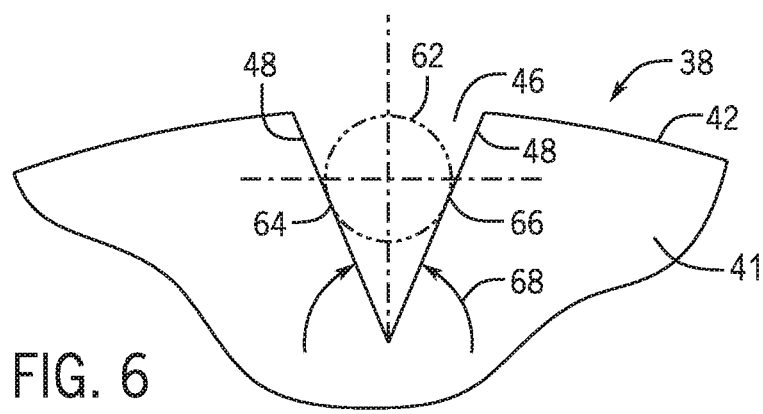
FIG. 6 is a detailed cut-away view of an example pivot-notch formed in the wafer of FIG. 5.
Figure 7:
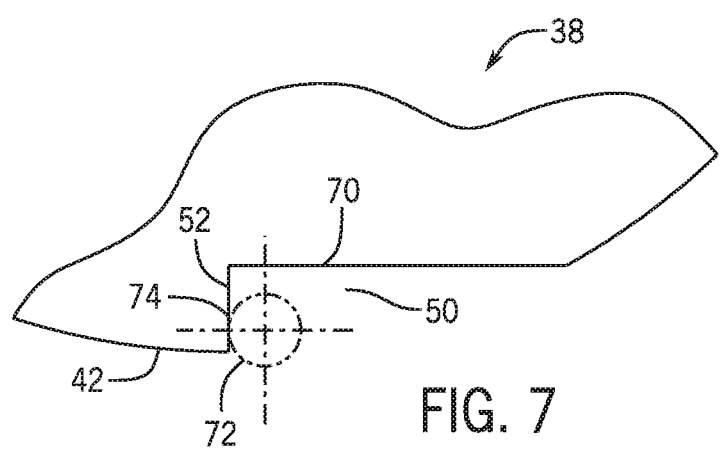
FIG. 7 is a detailed cut-away view of an example bias-notch formed in the wafer of FIG. 5.
Figure 8:
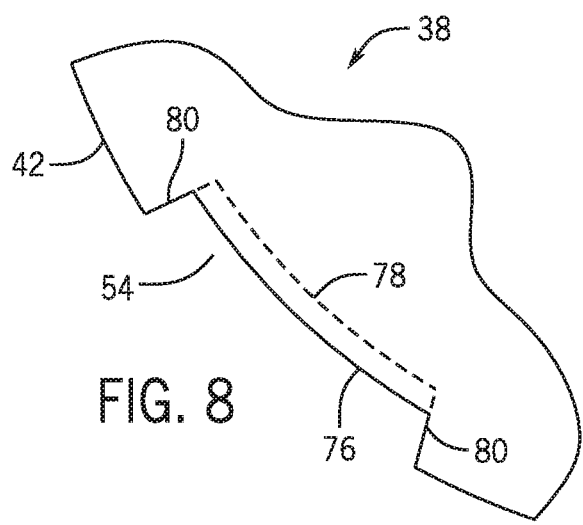
FIG. 8 is a detailed cut-away view of an example stop-notch formed in the wafer of FIG. 5.

FIGS. 6, 7 and 8 respectively illustrate the notches 46, 54, and 50 in somewhat greater detail. As shown in FIG. 6, the pivot-notch 46 comprises the edges 48 that allow receipt of a two-contact element 62 that, during the wafer alignment process, contacts the edges 48 at two points of contact 64 and 66. The edges 48 meet in a desired angle 68 (which forms the included angle). Because the pivot-notch 46 is formed by reference to the features 34 on or in the wafer 38, the locations of the points of contact 64 and 66 are known references for alignment, based on the size and geometry of the two-contact element 62 and the angle 68 between the pivot-notch edges 48. Similarly, as illustrated in FIG. 7, the location and orientation of the reference surface 52 of the stop-notch 50 is selected to allow a single-contact element 72 to be received in the stop-notch 50 during the alignment process, creating a point of contact 74 at a known location. Combined, the contact points 64, 66 of the pivot-notch 46 and contact point 74 of the stop-notch 50 form a three-point of contact system or reference frame for alignment. As illustrated in FIG. 8, the bias-notch 54 has a contact surface 76 or 78, which may be generally arcuate as shown. In a contemplated example, while the pivot-notch 46 of each wafer 38 to be aligned may be at the same location with respect to features 34 of each of the wafer 38 to be aligned, and the stop-notch 50 of each wafer 38 to be aligned may be at the same location with respect to features 34 of each of the wafers 38 to be aligned, the contact surfaces 76, 78 of the bias-notches 54 of each of the wafers 38 may be offset from one another as indicated by reference numerals 76 and 78 in FIG. 8. This offset allows for a biasing force to be applied to the wafers 38 during alignment. Recess edges 80 allow for location of the contact surfaces 76, 78 of the bias-notches 54.

While any type, material, or shape of the wafers 38 may be used, in presently contemplated examples, the wafers 38 are round, and may comprise glass, such as Eagle XG glass available from Corning Glass, of New York, USA. In this example, the lower wafer (e.g., used to form lower plate 14) has a nominal thickness ranging from about 0.7 mm to about 1.1 mm, while the upper wafer (e.g., used to form upper plate 12) has a nominal thickness ranging from about 0.3 mm to about 0.7 mm, and the wafers 38 have a nominal diameter of ranging from about 200 mm to about 300 mm. Like the thickness, the diameter may vary depending upon the size of the item to be formed, as well the ability to accurately cut the wafers 38. Again, however, these materials, forms and sizes are for example only, and the techniques disclosed are not limited to such materials or configurations.

Moreover, it may also be noted that the disclosed techniques are not limited to alignment of two wafers 38, but may be employed for alignment of three or more wafers 38. As such, three or more wafers 38 may be employed for notching, for fixturing, and for the other processes as disclosed. The notches 46, 50, 54, and their shapes, placement, and/or configuration may be altered from those disclosed depending upon such factors as the application in which the wafers 38 will be used, the materials of the wafers 38, the thicknesses of the wafers 38, and so forth. For example, the offset or overhang of the bias-notch 54 contact surfaces 76, 78 may be adapted such that a pusher or biasing device may act on one or more of the wafers 38 to properly seat and register such wafer(s) 38 against the contact or datum points of the notches 46, 50. In such cases, the biasing device may not be restricted by the thickness of the wafer 38 it pushes. This approach may allow for alignment of two or more wafers 38, with the fixture having provisions for independent biasing of each wafer 38.

Figure 9:
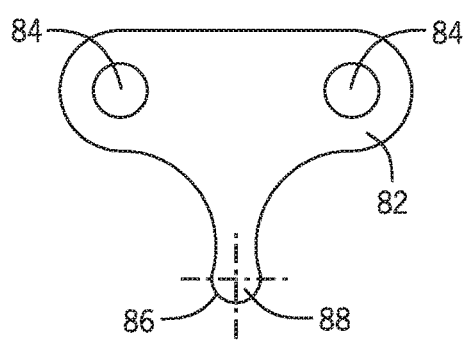
FIG. 9 is a plan view of an example two-contact element that may be used for two-point contact in the pivot-notch of the wafer of FIG. 5.
Figure 10:
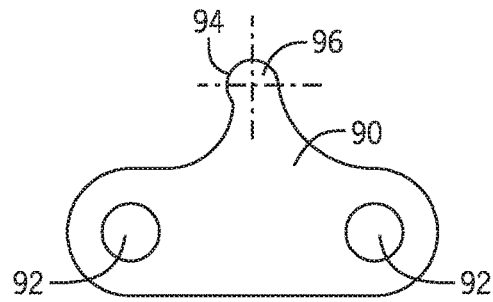
FIG. 10 is a plan view of an example single-contact element that may be used for single-point contact with the stop-notch of the wafer of FIG. 5.

The contact elements used in conjunction with the pivot-notch 46 and the stop-notch 50 may take any suitable form. Example elements are illustrated in FIGS. 9 and 10. The two-point contact element 82 (i.e., two-contact element 62) of FIG. 9 is designed to interface with the pivot-notch 46 and in particular, with the reference edges 64, 66 of the pivot-notch 46, to provide the desired two-point contact. In the illustrated example, the element 82 comprises securement apertures 84 that allow the element 82 to be secured at a known reference location on an alignment fixture. A reference surface 86 is provided on a tip 88 that is located at a desired location with reference to the apertures 84. The single-point contact element 90 (i.e., single-contact element 72) of FIG. 10 provides the desired single-point contact with the stop/reference surface 52 of the stop-notch 50. Single-point contact element 90 has securement apertures 92 that allow the element 90 to be secured at a known reference location on the alignment fixture, and a reference surface 94 on a tip 96 that provides the desired point of contact.

Figure 11:
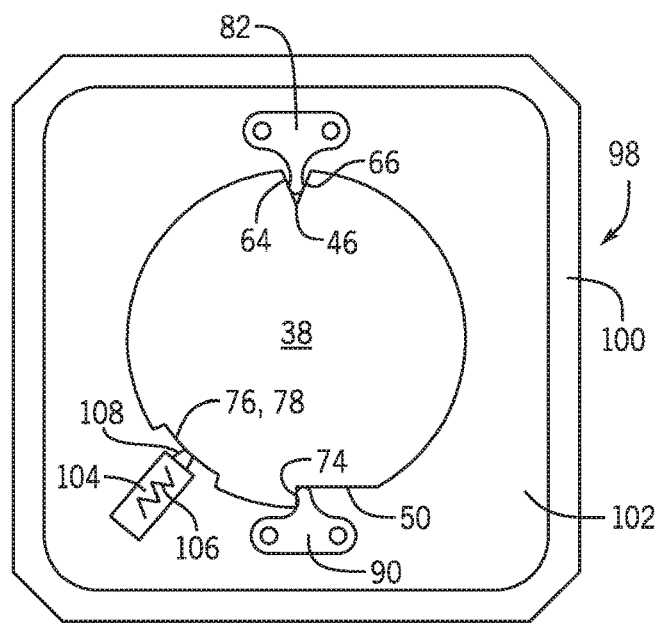
FIG. 11 is a plan view of an example fixture for aligning two notched wafers.

FIG. 11 illustrates an example alignment fixture 98 that may serve to facilitate alignment of the wafers 38. As shown, the contact elements 82 and 90 are secured to this fixture 98 at known locations so as to precisely locate the wafers 38 by contact with the reference edges or surfaces 64, 66, 52 of the pivot-notch 46 and the stop-notch 50. A biasing device or pusher 104 allows for contact in the bias-notches 76 and 78 of both wafers 38. In this example, the biasing device 104 is secured to the fixture 98, and includes a spring 106 and contact elements 108 that contact the wafers 38 to urge the wafers 38 into alignment. In a presently contemplated example, the biasing device 104 may be withdrawn manually or by an actuator (not shown) and released after the wafers 38 have been placed in/on the fixture 98. In this example, the biasing device 104 may have two contact elements 108 that move under the force of the spring 106 to contact respective wafers 38 to move them into alignment.

Figure 12:
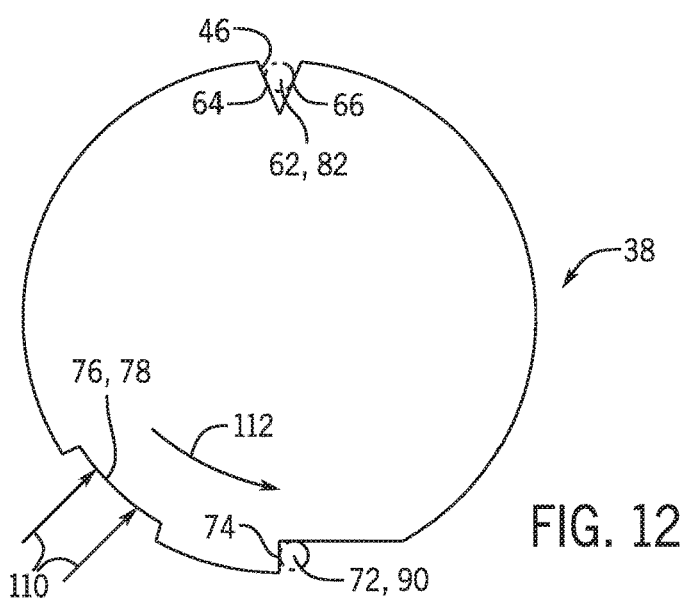
FIG. 12 is a plan view of the example contacts and forces exerted on a notched wafer for alignment.

The location of the wafers 38 under the forces applied by the biasing device 104 is illustrated in FIG. 12. As shown, the pivot-notch 46 is placed with respect to the two-point contact element 82/two-contact element 62 such that the element 82, 62 enters into the pivot-notch 46 and makes two points of contact with the edges 64, 66 of the pivot-notch 46. At this point, the wafers 38 may be displaced from the single-point contact element 90. Upon exertion of the biasing force, the first and second wafers pivot about a pivotal center defined by the two-contact element 62, 82 and the first and second pivot-notches 46 until the single-contact element 90, 72 rests against the stop surface 52 of each of the first and second stop-notches 50. Forces 110 are applied by the release of the biasing device 104 to rotate or swing the wafers 38 towards the single-point contact element 90/single-contact element 72, as indicated by arrow 112. Once contact is made at the three points described, the wafers 38 are aligned with one another.

Figure 13:
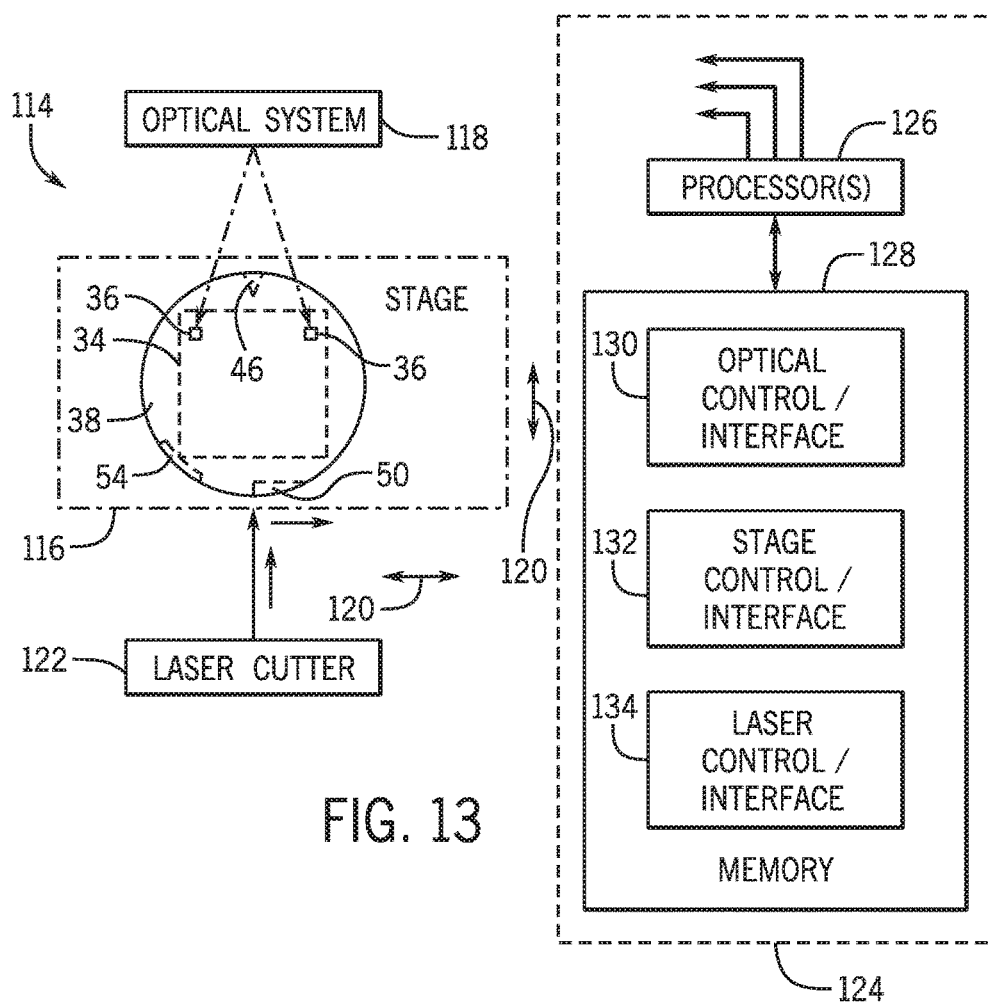
FIG. 13 is a diagrammatical view of an example notching station for notching a wafer to be aligned.

FIG. 13 illustrates, diagrammatically, an example workstation 114 for notching the wafers 38 as described above. The notching station may include a stage 116 on which the wafers 38 may be placed, and that can be moved by motors (not separately shown) as indicated by arrows 120. For forming the notches 46, 50, 54, each wafer 38 may be placed on the stage 116, and the features 34 (e.g., fiducial markers 36) formed on or in the wafer 39 may be imaged and detected by an optical system 118. The optical system 118, for example, may make images of the wafer 38 and produce image data in which the reference features 34 are detectable by image processing. For forming the notches 46, 50, 54 at the desired locations, a laser cutter 122 is provided, which directs a laser to the wafer 38, and may move the laser to cut the notches 46, 50, 54 at the desired locations.

The system 114 further includes control circuitry, as indicated by reference numeral 124. The control circuitry 124 comprises one or more processing circuits 126 (e.g., digital processing circuits, such as one or more microprocessors, multi-core processors, field programmable gate arrays (FPGA), application-specific processors or circuits, or general purpose computers). Memory circuitry 128 (e.g., solid state memory devices, dynamic memory devices, on and/or off-board memory devices, and so forth) stores data, parameters, and routines implemented by the processing circuitry for detecting the wafer 38, its reference features 34, and for moving the stage 116 and controlling application and movement of the laser. Memory circuitry 128 may store machine-executable instructions for controlling, for example, one or more computers, processors, or other devices of the system 114 to provide certain functionality.

Thus, optical control programming and interface data 130 may be stored in the memory circuitry 128 for controlling the optical system 118 and the feature recognition routines. Stage control and interface data 132 may be stored for controlling the stage 116 movement. And laser control and interface data 134 may be stored for controlling power to the laser and for moving the laser to cut the notches 46, 50, 54 at the desired locations with respect to the reference features 34.

Figure 14:
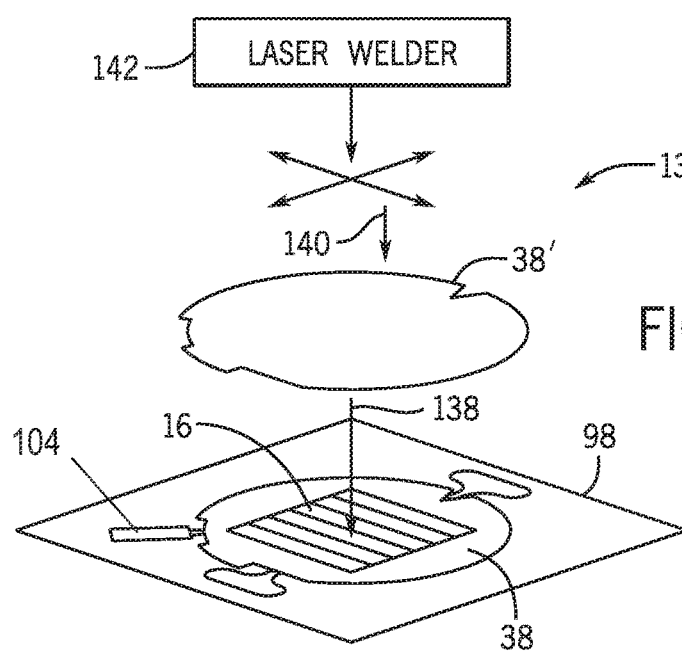
FIG. 14 is a diagrammatical view of an example bonding station for bonding two aligned wafers with respect to one another in an aligned orientation.

FIG. 14 illustrates, diagrammatically, an example alignment station 136. For alignment, the wafers 38 to be aligned have the desired features 34 formed in or on one or more of their surfaces, and the notches 46, 50, 54 cut by reference to at least some of these features 34. The wafers 38 are then placed on the fixture 98 as described above. In a presently contemplated example, the bottom wafer 38 (used to form lower plate 14) already has the intermediate element or interposer 16 bonded to its surface. This prepared lower wafer 38 is placed on the fixture 98 as indicated by arrow 138, and the upper wafer 38' is then lowered into place on the interposer 16 as indicated by arrow 140. The biasing device 104 is released to urge the wafers 38, 38' into alignment by contact with the contact elements 82 (62) and 90 (72) discussed above. A laser welder 142 may then be actuated to bond the interposer 16 to the upper wafer 38'. In other examples and applications, other bonding or securement techniques may be used, including bonding agents, glues, clamps, and so forth.

Figure 15:
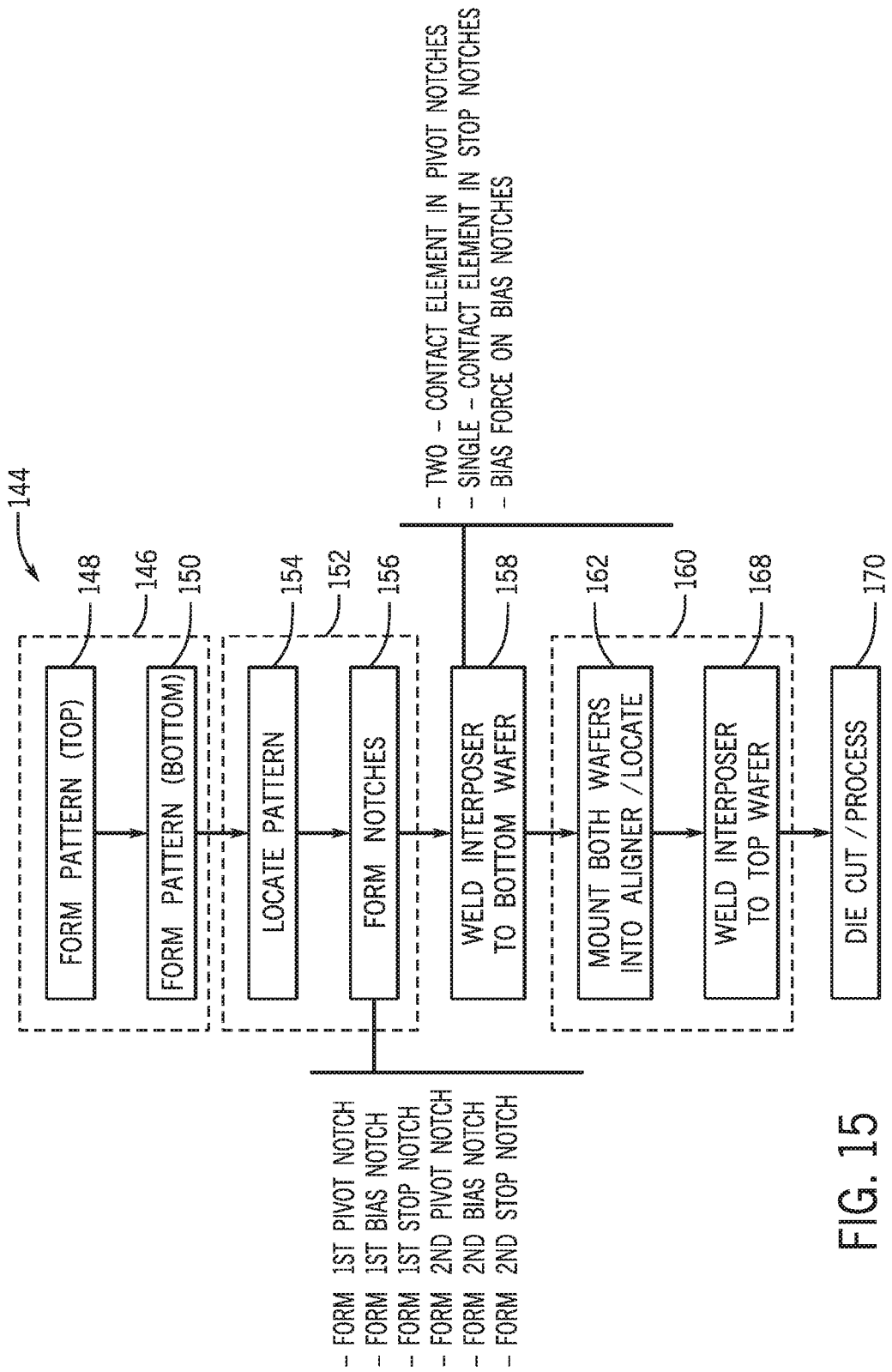
FIG. 15 is a flow chart illustrating example processes in notching, aligning and bonding two wafers with respect to one another.

FIG. 15 is a flow chart illustrating example logic in a method for wafer 38, 38' alignment as disclosed. The process 144 may include feature forming process 146, in which features 34 are (e.g., a pattern is) formed in each of the wafers 38, 38', as indicated by reference numerals 148 and 150. It may be noted that the features 34, any pattern of the features 34, and the layout of the features 34 need not be identical for the upper and lower wafers 38', 38. In a notch forming process 152, then, the features 34 are located (reference numeral 154), such as optically, as discussed above, and the reference locating notches 46, 50, 54 are formed in the respective wafers 38, 38', such as by laser cutting (reference numeral 156). It may be noted, however, that in some examples, the features 34 may be formed after notching, or the features 34 may be formed both before and after notching. When formed after notching, the features 38 may be formed by reference to the notch(es) 46, 50, 54 and/or by reference to the edges 48 or reference surface 50.

In the contemplated example described above, then, an intermediate element or interposer 16 is bonded to the lower wafer 38 (reference numeral 158). This could be performed before locating the wafer 38 in the disclosed fixture 98, or with the wafer 38 already located in the fixture 98. Also, where no such intermediate element 16 is used, this operation may be omitted. Conversely, this operation may include processing to add one or more elements to the wafer 38', such as in an overlapped manner, or at different locations on the wafer 38'. It should be noted that in this process, the terms "upper" and "lower" referring to the wafers 38, 38' may be reversed, with any such assemblies being done on one or the other wafer 38, 38', or both.

The process then includes alignment and securing the wafers 38, 38' with respect to one another, as indicated by reference numeral 160. Here, at reference numeral 162, both wafers 38, 38' are placed in/on the fixture 98, and are aligned as discussed above. The wafers 38, 38' may then be secured in the aligned positions, such as by welding an interposer 16 to the top wafer 38', as indicated by reference numeral 168. Following alignment and securement, the wafers 38, 38' may be processed in any desired manner. For example, where the wafers 38, 38' define assembled structures, such as flow cells 10, or portions of flow cells 10, the individual assemblies may be cut or otherwise separated from one another and from surrounding material, as indicated at 170. Thereafter any further processing, assembly, or finishing may be performed.

Additional Notes

It is to be understood that the ranges provided herein include the stated range and any value or sub-range within the stated range. For example, a range of from about 0.7 mm to about 1.1 mm, should be interpreted to include not only the explicitly recited limits of from about 0.7 mm to about 1.1 mm, but also to include individual values, such as about 0.9 mm, 1.08 mm, etc., and sub-ranges, such as from about 0.8 mm to about 1.0 mm, etc.

The term "about" used throughout this disclosure, including the claims, is used to describe and account for small fluctuations, such as due to variations in processing. For example, they can refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

The terms "comprise," "include," "contain," etc., and variations thereof, that are used in the specification and claims herein are intended to be open-ended, including not only the recited elements, but further encompassing any additional elements. Reference throughout the specification to "one example", "another example", "an example", and so forth, means that a particular element (e.g., feature, structure, and/or characteristic) described in connection with the example is included in at least one example described herein, and may or may not be present in other examples. In addition, it is to be understood that the described elements for any example may be combined in any suitable manner in the various examples unless the context clearly dictates otherwise.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

While several examples have been described in detail, it is to be understood that the disclosed examples may be modified. Therefore, the foregoing description is to be considered non-limiting.

What is claimed is:

1. A method, comprising:
    forming a first pivot-notch, a first stop-notch, and a first bias-notch in a first wafer by reference to first features formed on or in the first wafer;
    forming a second pivot-notch, a second stop-notch, and a second bias-notch in a second wafer by reference to second features formed on or in the second wafer;
    mounting the first wafer in an aligning device, wherein a two-contact element enters into the first pivot-notch, and a single-contact element enters the first stop-notch;
    mounting the second wafer in the aligning device, wherein the two-contact element enters into the second pivot-notch, and the single-contact element enters the second stop-notch; and
    exerting a biasing force onto surfaces of the first and second bias-notches to align the first features with the second features.

2. The method of claim 1, further comprising bonding the first wafer to the second wafer after the first and second features are aligned.

3. The method of claim 2, further comprising securing a spacing element to the first wafer prior to alignment, wherein the second wafer is bonded to the spacing element.

4. The method of claim 1, further comprising forming, using at least laser cutting, the first and second pivot-notches, the first and second stop-notches, and the first and second bias-notches.

5. The method of claim 4, wherein the first and second features comprise patterned arrays or fiducials disposed in or adjacent to the patterned arrays.

6. The method of claim 1, wherein the biasing force is exerted by a spring-loaded pusher that contacts the surfaces of the first and second bias-notches.

7. The method of claim 1, wherein upon exertion of the biasing force, the first and second wafers pivot about a pivotal center defined by the two-contact element and the first and second pivot-notches until the single-contact element rests against a stop surface of each of the first and second stop-notches.

8. The method of claim 1, wherein aligned positions of the first and second wafers are defined by two-point contact of the pivot-notches with the two-contact element, and single-point contact of the stop-notches with the single-contact element.

9. The method of claim 8, wherein the first and second bias-notches are formed at different distances from the first and second features, respectively.

* * * * *